(12) United States Patent
Kwak et al.

(10) Patent No.: US 8,581,812 B2
(45) Date of Patent: Nov. 12, 2013

(54) ORGANIC LIGHT EMITTING DISPLAY DEVICE WITH DATA DISTRIBUTOR

(75) Inventors: Won-Kyu Kwak, Yongin (KR); Dong-Wook Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 193 days.

(21) Appl. No.: 12/783,481

(22) Filed: May 19, 2010

(65) Prior Publication Data

US 2011/0025669 A1 Feb. 3, 2011

(30) Foreign Application Priority Data

Jul. 29, 2009 (KR) .................. 10-2009-0069427

(51) Int. Cl.
*G09G 3/32* (2006.01)
*G09G 3/30* (2006.01)

(52) U.S. Cl.
USPC .............................................. 345/82; 345/76

(58) Field of Classification Search
USPC ................ 345/76–84, 213, 68–70; 315/169.1
See application file for complete search history.

(56) References Cited

U.S. PATENT DOCUMENTS

| 6,771,028 | B1* | 8/2004 | Winters | 315/169.1 |
|---|---|---|---|---|
| 7,995,011 | B2* | 8/2011 | Jeong et al. | 345/76 |
| 2005/0225548 | A1* | 10/2005 | Han et al. | 345/213 |
| 2007/0046581 | A1* | 3/2007 | Kwak et al. | 345/68 |
| 2007/0057877 | A1* | 3/2007 | Choi et al. | 345/76 |
| 2007/0139312 | A1* | 6/2007 | Kwak | 345/76 |
| 2009/0021534 | A1 | 1/2009 | Tomizawa et al. | |
| 2009/0167648 | A1 | 7/2009 | Jeon et al. | |
| 2009/0225009 | A1* | 9/2009 | Ka | 345/76 |

FOREIGN PATENT DOCUMENTS

| EP | 1 635 324 A1 | 3/2006 |
|---|---|---|
| EP | 1 764 771 A2 | 3/2007 |
| EP | 2 280 391 B1 | 1/2012 |
| JP | 2004-117431 | 4/2004 |
| JP | 2004-335169 | 11/2004 |
| JP | 2005-128190 | 5/2005 |

(Continued)

OTHER PUBLICATIONS

KIPO Office action dated Aug. 29, 2011, for Korean priority Patent application 10-2009-0069427, as well as JP 2004-335169 and KR 10-0887639 (KR Publication 10-2003-0062310), previously submitted in an IDS dated Feb. 3, 2011, 1 page.

(Continued)

*Primary Examiner* — Chanh Nguyen
*Assistant Examiner* — James Nokham
(74) *Attorney, Agent, or Firm* — Christie, Parker & Hale, LLP

(57) ABSTRACT

An organic light emitting display device includes a display region including first sub-pixels, second sub-pixels and third sub-pixels at crossing regions of scan lines and data lines and arranged in a repeating pattern, the first, second and third sub-pixels for emitting light of different colors, a scan driver for supplying scan signals to the scan lines; a data driver for supplying data signals to the data lines; and a data distributor between the data driver and the data lines for distributing the data signals from output lines of the data driver to the data lines. Ones of the first and second sub-pixels are alternately arranged in a first column, and ones of the third sub-pixels are arranged in a second column adjacent to the first column.

12 Claims, 3 Drawing Sheets

(56) References Cited

FOREIGN PATENT DOCUMENTS

| | | |
|---|---|---|
| JP | 2006-065286 | 3/2006 |
| JP | 2006-119404 | 5/2006 |
| JP | 2007-079580 | 3/2007 |
| JP | 2008-500563 | 1/2008 |
| KR | 10-2003-0062310 | 7/2003 |
| KR | 1020050003753 A | 1/2005 |
| KR | 1020080002395 A | 1/2008 |
| KR | 1020090006615 A | 1/2009 |
| KR | 10-2009-0057705 | 6/2009 |
| WO | WO 2006/115165 A1 | 11/2006 |

OTHER PUBLICATIONS

European Search Report dated Aug. 26, 2010, for corresponding European Patent application 10168201.1.

Japanese Office action dated Jun. 5, 2012, for corresponding Japanese Patent application 2010-056094, (3 pages).

* cited by examiner

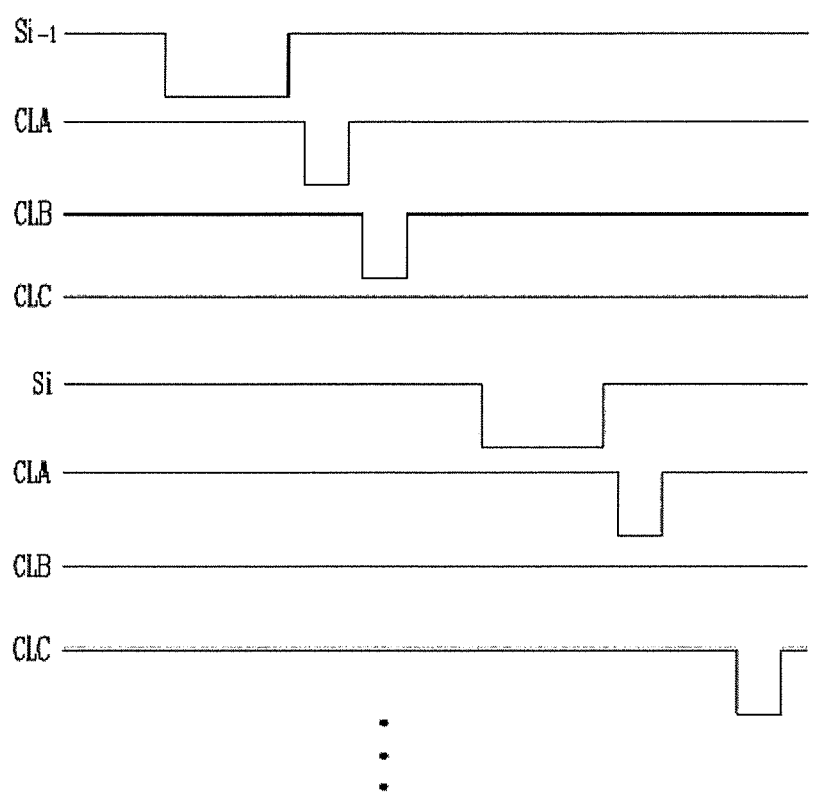

ORGANIC LIGHT EMITTING DISPLAY DEVICE WITH DATA DISTRIBUTOR

CROSS-REFERENCE TO RELATED APPLICATIONS

This application claims priority to and the benefit of Korean Patent Application No. 10-2009-0069427, filed on Jul. 29, 2009, in the Korean Intellectual Property Office, the entire content of which is incorporated herein by reference.

BACKGROUND

1. Field

The following description relates to an organic light emitting display device.

2. Description of the Related Art

An organic light emitting display device displays images using organic light emitting diodes as luminescent elements. The organic light emitting display device is considered one of the next-generation display devices because of its excellent luminance and color purity.

In such an organic light emitting display device, a plurality of pixels are formed by using red, green and blue sub-pixels, and accordingly, various color images are displayed.

The perception of colors is influenced by a process known as assimilation or the Von Bezold color blending effect.

Therefore, an arrangement structure of pixels is optimized when using the process so that high resolution can be realized.

Accordingly, the organic light emitting display device may have a structure in which first and second sub-pixels for emitting light of different colors in one column are alternately arranged.

However, in such a data driver, data of first and second colors would be alternately supplied to one data line. If additional data lines are utilized and the data driver is directly connected to those data lines, the number of output lines of the data driver is increased, and therefore, it is more difficult to develop a driving integrated circuit (IC) with such a data driver. Further, a design space necessary for the arrangement of output lines of the driving IC is increased, and therefore, a dead space or size of a non-display region is increased.

SUMMARY OF THE INVENTION

Accordingly, exemplary embodiments of the present invention provide an organic light emitting display device having a data driver with a decreased number of output lines by utilizing a data distributor and employing an arrangement structure of pixels for improving resolution.

According to an aspect of an exemplary embodiment of the present invention, there is provided an organic light emitting display device, which includes a display region including first sub-pixels, second sub-pixels and third sub-pixels at crossing regions of scan lines and data lines and arranged in a repeating pattern, the first second and third sub-pixels for emitting light of different colors; a scan driver for supplying scan signals to the scan lines; a data driver for supplying data signals to the data lines; and a data distributor between the data driver and the data lines for distributing the data signals from output lines of the data driver to the data lines, wherein ones of the first and second sub-pixels are alternately arranged in a first column, and ones of the third sub-pixels are arranged in a second column adjacent to the first column, and wherein a first data line of the data lines connects the first sub-pixels in the first column to the data distributor and a second data line of the data lines connects the second sub-pixels in the first column to the data distributor.

The organic light emitting display device may further include a third column adjacent to the second column in which other ones of the first and second sub-pixels are alternately arranged, and a fourth column adjacent to the third column in which other ones of the third sub-pixels are arranged, wherein the first and second sub-pixels in the first and third columns may be respectively arranged diagonally about the second column in a substantially checkerboard arrangement.

A width of the third sub-pixels may be narrower along a horizontal axis than a width of each of the first and second sub-pixels, and a number of the third sub-pixels may be two times a number of each of the first and second sub-pixels.

The repeating pattern may be divided into sub-pixel groups each including two first sub-pixels, two second sub-pixels and four third sub-pixels, arranged in two adjacent rows and four adjacent columns. Each of the sub-pixel groups may include one first sub-pixel and one second sub-pixel sequentially arranged in the first column; two third sub-pixels arranged in the second column; one second sub-pixel and one first sub-pixel sequentially arranged in a third column adjacent to the second column; and two third sub-pixels arranged in a fourth column adjacent to the third column.

The first sub-pixels may be red sub-pixels, the second sub-pixels may be blue sub-pixels, and the third sub-pixels may be green sub-pixels.

The data distributor may include a plurality of first transistors for connecting data lines connected to the third sub-pixels from among the data lines to corresponding ones of the output lines of the data driver when a first clock signal is supplied; a plurality of second transistors for connecting data lines connected to the first and second sub-pixels in odd-numbered rows from among the data lines to the corresponding ones of the output lines of the data driver when a second clock signal is supplied; and a plurality of third transistors for connecting data lines connected to the first and second sub-pixels in even-numbered rows from among the data lines to the corresponding ones of the output lines of the data driver when a third clock signal is supplied, wherein the first, second and third clock signals do not overlap with one another.

The scan signals may be sequentially supplied to the scan lines, the first clock signal may be supplied to the data distributor after each of the scan signals is supplied, and the second and third clock signals may be alternately supplied to the data distributor after each of the scan signals is supplied.

The first and second dock signals may be sequentially supplied during a period between when a scan signal of the scan signals is supplied to an (i−1)-th scan line of the scan lines ("i" is a natural number) and when a scan signal of the scan signals is supplied to an i-th scan line of the scan lines. The first and third dock signals may be sequentially supplied during a period between when the scan signal is supplied to the i-th scan line and when a scan signal of the scan signals is supplied to an (i+1)-th scan line of the scan lines.

The data lines may include a plurality of first data lines for respectively connecting the first sub-pixels in corresponding columns to the data distributor; a plurality of second data lines for respectively connecting the second sub-pixels in corresponding columns to the data distributor; and a plurality of third data lines for respectively connecting the third sub-pixels in corresponding columns to the data distributor.

A number of the first data lines, a number of the second data lines, and a number of the third data lines may be the same as one another.

A number of the third sub-pixels may correspond to a resolution of the display region, and a number of the first sub-pixels and a number of the second sub-pixels may correspond to half of the resolution of the display region.

According to exemplary embodiments of the present invention, high resolution can be implemented by employing the above described arrangement structure of pixels, in which the first and second sub-pixels are arranged in a substantially checkerboard arrangement, and where the third sub-pixels are arranged between columns in which the first and second sub-pixels are arranged.

Further, the data distributor is applied so that first and second sub-pixels positioned on the same column do not share one data line with each other but are separately coupled to first and second data lines, respectively. Accordingly, a driving IC can be more readily developed, the range of applications can be increased, and the number of output lines of the data driver can be decreased.

BRIEF DESCRIPTION OF THE DRAWINGS

The accompanying drawings, together with the specification, illustrate exemplary embodiments of the present invention, and, together with the description, serve to explain the principles of the present invention.

FIG. 3 is a waveform diagram illustrating a driving method of the organic light emitting display device illustrated in FIG. 1.

DETAILED DESCRIPTION OF THE INVENTION

Figure 1:
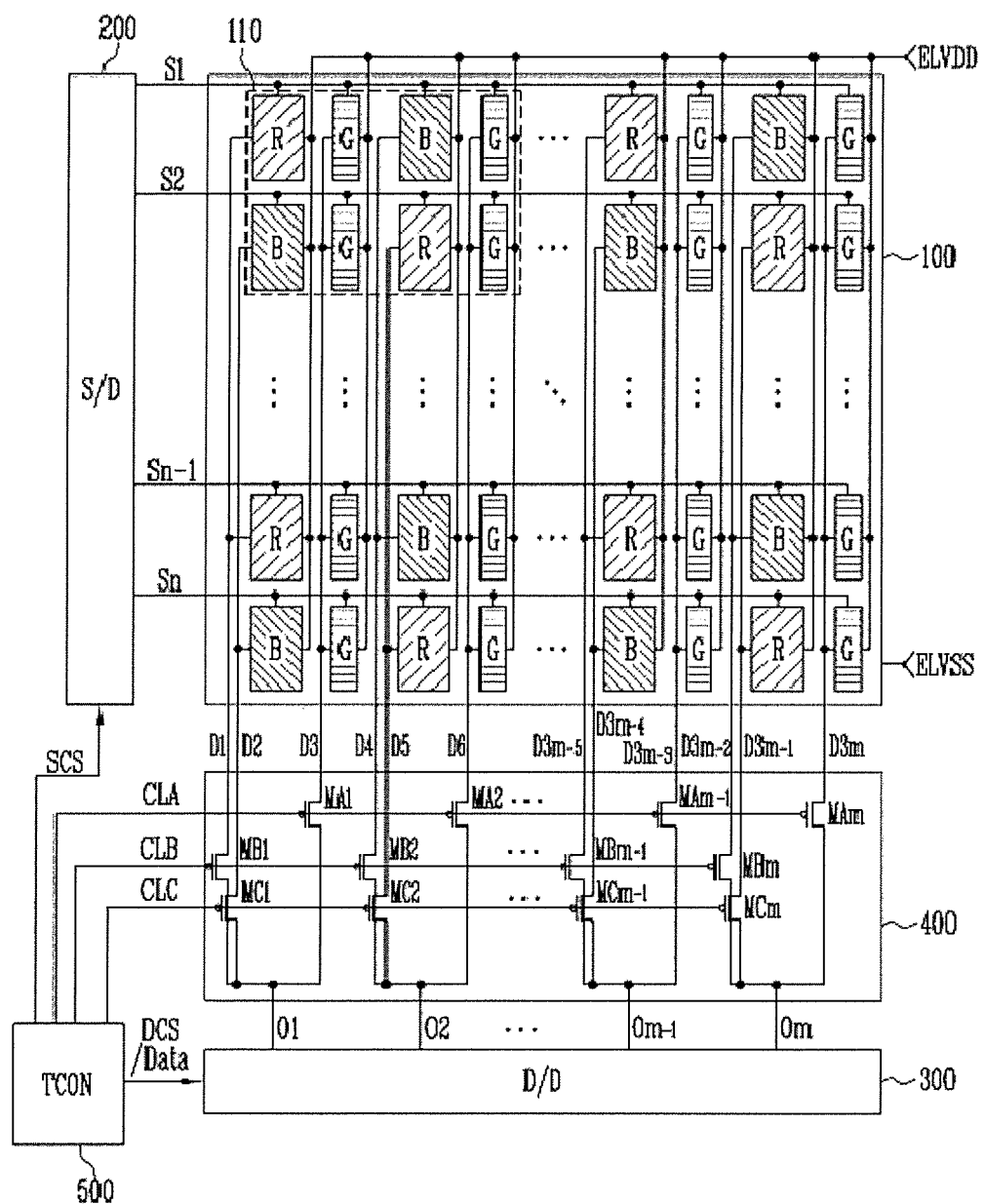
FIG. 1 is a plan view schematically illustrating an organic light emitting display device according to an embodiment of the present invention.

Hereinafter, certain exemplary embodiments according to the present invention will be described with reference to the accompanying drawings. Here, when a first element is described as being coupled to a second element, the first element may be directly coupled to the second element, or may be indirectly coupled to the second element via one or more additional elements. Further, some of the elements that are not essential to the complete understanding of the invention are omitted for clarity. Also, like reference numerals refer to like elements throughout.

Figure 2:
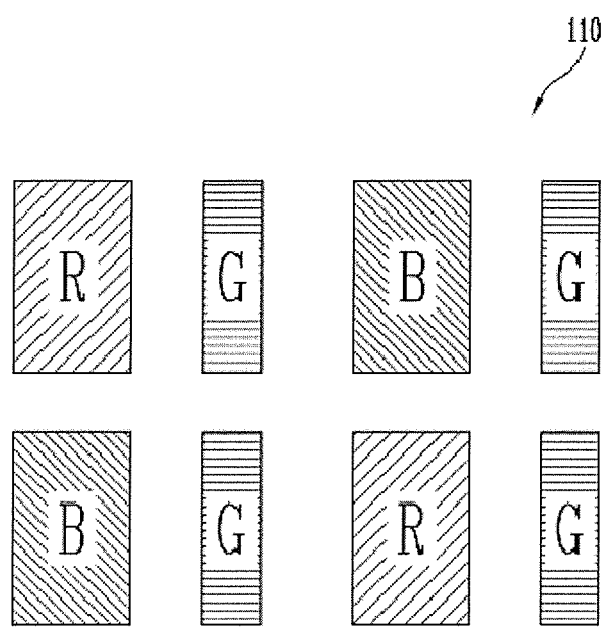
FIG. 2 is an enlarged plan view schematically illustrating a sub-pixel group illustrated in FIG. 1.

FIG. 1 is a plan view schematically illustrating an organic light emitting display device according to an embodiment of the present invention. FIG. 2 is an enlarged plan view schematically illustrating a sub-pixel group illustrated in FIG. 1.

Referring to FIGS. 1 and 2, the organic light emitting display device according to the embodiment of the present invention includes a display region 100, a scan driver 200, a data driver 300, a data distributor 400 and a timing controller 500.

The display region 100 includes first sub-pixels R, second sub-pixels B and third sub-pixels G, positioned at crossing regions of scan lines S1 to Sn and data lines D1 to D3m. The first, second and third sub-pixels R, B and G emit light of different colors.

For example, the first sub-pixels R are red sub-pixels for emitting red light, the second sub-pixels B are blue sub-pixels for emitting blue light, and the third sub-pixels G are green sub-pixels for emitting green light.

In the embodiment of the present invention, the first, second and third sub-pixels R, B and G are repeatedly arranged in a pattern in the display region 100. Here, the pattern is divided into sub-pixel groups 110 each having two first sub-pixels R, two second sub-pixels B and four third sub-pixels G.

Specifically, the first and second sub-pixels R and B are alternately arranged in a same column, and the third sub-pixels G are arranged in a column adjacent to the column in which the first and second sub-pixels R and B are arranged.

The first sub-pixels R are diagonally positioned around columns in which the third sub-pixels G are arranged, and the second sub-pixels B are also diagonally positioned around columns in which the third sub-pixels G are arranged. The first and second sub-pixels R and B are arranged in a substantially checkerboard arrangement. That is, the first sub-pixels R are alternately arranged in two adjacent rows. The second sub-pixels B are also alternately arranged in two adjacent rows.

In one embodiment, the width of the third sub-pixels G may be narrower along a horizontal axis than that of each of the first and second sub-pixels R and B, but the number of the third sub-pixels G may be two times greater than that of each of the first and second sub-pixels R and B.

For example, the third sub-pixels G may have a "separated" form. In the "separated" form, the third sub-pixels G are formed along the horizontal axis to have half of the width of each of the first and second sub-pixels R and B, but the number of the third sub-pixels G may be two times greater than that of each of the first and second sub-pixels R and B. The third sub-pixels G in such a "separated" form may be sub-pixels having a color that may be more sensitive to resolution (e.g., green sub-pixels), so that higher-quality images can be displayed.

The arrangement of the first, second and third sub-pixels R, B and G in a sub-pixel group 110 will be described in detail. As illustrated in FIG. 2, the sub-pixel group 110 includes two first sub-pixels R, two second sub-pixels B and four third sub-pixels G, which are arranged in two consecutive rows and four consecutive columns.

More specifically, in adjacent rows, one first sub-pixel R and one second sub-pixel B are sequentially arranged in a first column, and two third sub-pixels G are sequentially arranged in a second column adjacent to the first column. One second sub-pixel B and one first sub-pixel R are sequentially arranged in a third column adjacent to the second column, and two third sub-pixels G are sequentially arranged in a fourth column adjacent to the third column.

By employing the arrangement structure of pixels as described above, high resolution with respect to the number of sub-pixels R, G and B provided in the display region 100 can be implemented by a "sub-pixel rendering" technique. That is, a number of third sub-pixels may correspond to a resolution of the display device. Here, a number of first and second sub-pixels R and B may each correspond to half of the resolution of the display device.

In the embodiment of the present invention, the first and second sub-pixels R and B positioned in the same column do not share a same data line. That is, first data lines coupled to first sub-pixels R by column and second data lines coupled to second sub-pixels B by column are independent from each other.

The data lines D include a plurality of first data lines for connecting the first sub-pixels R to the data distributor 400 by column; a plurality of second data lines for connecting the second sub-pixels B to the data distributor 400 by column; and a plurality of third data lines for connecting the third sub-pixels G to the data distributor 400 by column. Therefore, the number of first, second and third data lines are the same.

As described above, if first and second sub-pixels R and B positioned in the same column do not share one data line, but are separately coupled to first and second data lines, respectively, the data distributor 400 may be employed between the data lines and the data driver 300. Accordingly, the number of output lines of the data driver 300 can be decreased, and a driving integrated circuit (IC) including the data driver 300 can be more easily developed.

The scan driver 200 generates scan signals corresponding to scan driving control signals SCS supplied from the timing controller 500. The scan signals generated from the scan driver 200 are sequentially supplied to the scan lines S1 to Sn.

The data driver 300 generates data signals corresponding to data and data driving control signals DCS, supplied from the timing controller 500. The data signals generated from the data driver 300 are supplied to the data distributor 400 through output lines O1 to Om of the data driver 300.

The data distributor 400 is coupled between the data driver 300 and the data lines D1 to D3m. The data distributor 400 distributes data signals respectively supplied from the output lines O1 to Om of the data driver 300 to the plurality of data lines D1 to D3m, corresponding to clock signals CLA, CLB, CLC supplied from the timing controller 500.

For example, the data distributor 400 may distribute data signals respectively outputted from the output lines O1 to Om of the data driver 300 to first, second and third data lines associated with each of the output lines.

To this end, the data distributor 400 includes a plurality of first transistors MA1, MA2, . . . , MAm, a plurality of second transistors MB1, MB2, . . . , MBm, and a plurality of third transistors MC1, MC2, . . . , MCm.

The first transistors MA1, MA2, . . . , MAm are coupled between the output lines O1 to Om of the data driver 300 and the third data lines corresponding to the third sub-pixels G, respectively. Gate electrodes of the first transistors MA1, MA2, . . . , MAm are coupled to an input line of the first clock signal CLA supplied from the timing controller 500.

The first transistors MA1, MA2, . . . , MAm are turned on during a period where the first clock signal CLA is supplied, to couple the output lines O1 to Om of the data driver 300 to the third data lines corresponding to the third sub-pixels G, respectively.

The second transistors MB1, MB2, . . . , MBm are coupled between the output lines O1 to Om of the data driver 300 and the first and second data lines corresponding to the first and second sub-pixels R and B positioned in odd-numbered rows, respectively. Gate electrodes of the second transistors MB1, MB2, . . . , MBm are coupled to an input line of the second clock signal CLB supplied from the timing controller 500.

The second transistors MB1, MB2, . . . , MBm are turned on during a period where the second clock signal CLB is supplied, to couple the output lines O1 to Om of the data driver 300 to the first and second data lines corresponding to the first and second sub-pixels R and B positioned in the odd-numbered rows, respectively.

The third transistors MC1, MC2, . . . , MCm are coupled between the output lines O1 to Om of the data driver 300 and the first and second data lines corresponding to the first and second sub-pixels R and B positioned in even-numbered rows, respectively. Gate electrodes of the third transistors MC1, MC2, . . . , MCm are coupled to an input line of the third clock signal CLC supplied from the timing controller 500.

The third transistors MC1, MC2, . . . , MCm are turned on during a period where the third clock signal CLC is supplied, to couple the output lines O1 to Om of the data driver 300 to the first and second data lines corresponding to the first and second sub-pixels R and B positioned in the even-numbered row, respectively.

Here, the first, second and third clock signals CLA, CLB and CLC for respectively turning on the first transistors MA1, MA2, . . . , MAm, the second transistors MB1, MB2, . . . , MBm, and the third transistors MC1, MC2, . . . , MCm are supplied during different periods which do not overlap with one another.

The first clock signal CLA is supplied to the data distributor 400 for every horizontal period where scan signals are sequentially supplied to the scan lines S1 to Sn. The second and third clock signals CLB and CLC are alternately supplied to the data distributor 400 corresponding to the horizontal period. In some embodiments, the period of the second and third clock signals CLB and CLC may be set to be two times greater than that of the first clock signal CLA.

For example, the first and second clock signals CLA and CLB may be sequentially supplied during the period between when a scan signal is supplied to an (i−1)-th scan line Si−1 ("i" is a natural number) and when a scan signal is supplied to an i-th scan line Si. During a subsequent horizontal period after the horizontal period where the first and second clock signals CLA and CLB are supplied, the first and third clock signals CLA and CLC may be supplied during, for example, the period between when the scan signal is supplied to the i-th scan line Si and when a scan signal is supplied to an (i+1)-th scan line Si+1.

The operation of the data distributor 400 will be described in greater detail below.

The timing controller 500 generates scan driving control signals SCS, data driving control signals DCS and clock signals CLA, CLB and CLC, corresponding to synchronization signals supplied from the outside.

The scan driving control signals SCS, the data driving control signals DCS and the clock signals CLA, CLB and CLC are supplied to the scan driver 200, the data driver 300 and the data distributor 400, respectively. The timing controller 500 also supplies data supplied from the outside to the data driver 300.

According to the embodiment of the present invention, high resolution can be implemented by employing the above described arrangement structure of pixels, in which the first and second sub-pixels R and B are arranged in substantially a checkerboard arrangement, and the third sub-pixels G are arranged between columns in which the first and second sub-pixels R and B are arranged.

Further, the data distributor 400 is applied so that first and second sub-pixels R and B positioned in a same column do not share a same data line, but are instead separately coupled to first and second data lines, respectively. Accordingly, a driving IC can be more easily developed, the range of applications can be increased, and the number of output lines of the data driver 300 can be decreased. Furthermore, as the number of output lines of the data driver 300 is decreased, a dead space or non-display region located approximate a lower portion of a panel can also be reduced.

Meanwhile, it has been described in this embodiment that the area of one first or second sub-pixel R or B is two times wider than that of one third sub-pixel G. However, the present invention is not limited thereto. That is, the areas of the first, second and third sub-pixels R, B and G may be modified, based on, for example, the lifetime of associated materials and/or various other factors.

Although it has been described in this embodiment that the data distributor 400 is a 3:1 demultiplexer, the present invention is not limited thereto. That is, it will be apparent that the data distributor 400 may be, for example, a 6:1 demultiplexer, a 9:1 demultiplexer, or the like.

FIG. 3 is a waveform diagram illustrating a driving method of the organic light emitting display device illustrated in FIG. 1. For convenience of illustration, only two scan signals sequentially supplied to consecutive rows are illustrated in FIG. 3.

Referring to FIG. 3, clock signals CLA, CLB and CLC are supplied during the periods between supply of the scan signals. Here, the first clock signal CLA is supplied for every horizontal period after a scan signal is supplied, and the second and third clock signals CLB and CLC are alternately supplied corresponding to the horizontal period.

Here, the scan signals are sequentially supplied to the scan lines corresponding to the horizontal period.

For example, a scan signal is supplied to an (i−1)-th scan line Si−1 ("i" is a natural number) during a horizontal period for selecting pixels (or sub-pixels) on an (i−1)-th row, and a scan signal is supplied to an i-th scan line Si during a subsequent horizontal period, i.e., a horizontal period for selecting pixels on an i-th row.

During the period between when the scan signal is supplied to the (i−1)-th scan line Si−1 and when the scan signal is supplied to the i-th scan line Si, a first clock signal CLA and either a second or third clock signal CLB or CLC are supplied to the data distributor 400. Here, the first clock signal CLA and either the second or third clock signal CLB or CLC are used to pre-charge data lines of pixels selected by an i-th scan signal to receive data signals.

For example, it is assumed that the "i" is an odd number. After a scan signal is supplied to the scan line Si−1 on the (i−1)-th row, the first and second clock signals CLA and CLB are sequentially supplied to the data distributor 400. At this time, the third clock signal CLC maintains a high-level state so that the third transistors MC1, MC2, . . . , MCm maintain a turned-off state.

When the first clock signal CLA is supplied, the third data lines corresponding to the third sub-pixels G are coupled to the output lines O1 to Om of the data driver 300, and data signals are supplied to the third data lines. At this time, the data driver 300 outputs data signals to be supplied to third sub-pixels G in the i-th row, and the third data lines corresponding to the third sub-pixels G are pre-charged with data signals for the third sub-pixels G in the i-th row.

When the second clock signal CLB is supplied, the first and second data lines corresponding to the first and second sub-pixels R and B positioned in the odd-numbered rows are coupled to the output lines O1 to Om of the data driver 300, and data signals are supplied to those first and second data lines. At this time, the data driver 300 outputs data signals to be supplied to first and second sub-pixels R and B in the i-th row, and the first and second data lines corresponding to the first and second sub-pixels R and B in the odd-numbered rows are pre-charged with data signals for the first and second sub-pixels R and B in the i-th row, respectively.

Thereafter, when a scan signal is supplied to the i-th scan line Si, the data signals pre-charged in the first to third data lines are supplied to the first to third sub-pixels R, B and G positioned in the i-th row, respectively.

Meanwhile, after the scan signal is supplied to the i-th scan line, first and third clock signals CLA and CLC are sequentially supplied to the data distributor 400. At this time, the second clock signal CLB maintains a high-level state so that the second transistors MB1, MB2, . . . , MBm maintain a turned-off state.

When the first clock signal CLA is supplied, the third data lines corresponding to the third sub-pixels G are coupled to the output lines O1 to Om of the data driver 300, and data signals are supplied to the third data lines. At this time, the data driver 300 outputs data signals to be supplied to third sub-pixels G in the (i+1)-th row, and the third data lines corresponding to the third sub-pixels G are pre-charged with data signals for the third sub-pixels G in the (i+1)-th row.

When the third clock signal CLC is supplied, the first and second data lines corresponding to the first and second sub-pixels R and B positioned in the even-numbered rows are coupled to the output lines O1 to Om of the data driver 300, and data signals are supplied to those first and second data lines. At this time, the data driver 300 outputs data signals to be supplied to first and second sub-pixels R and B in the (i+1)-th row, and the first and second data lines corresponding to the first and second sub-pixels R and B on the even-numbered rows are pre-charged with data signals for the first and second sub-pixels R and B in the (i+1)-th row, respectively.

Meanwhile, although not shown in this figure for convenience of illustration, when a scan signal is supplied to an (i+1)-th scan line Si+1, the data signals pre-charged in the first to third data lines are supplied the first to third sub-pixels R, G and B positioned in the (i+1)-th row, respectively.

In the same manner as described above, data signals are sequentially supplied to the first to third sub-pixels R, G and B by row during the horizontal periods.

Accordingly, each of the sub-pixels R, G and B stores a data signal corresponding to the respective sub-pixel and emits light having luminance corresponding to the respective data signal, thereby displaying an image in the display region 100.

While the present invention has been described in connection with certain exemplary embodiments, it is to be understood that the invention is not limited to the disclosed embodiments, but is instead intended to cover various modifications and equivalent arrangements included within the spirit and scope of the appended claims, and equivalents thereof.

What is claimed is:

1. An organic light emitting display device, comprising:
    a display region comprising first sub-pixels, second sub-pixels and third sub-pixels at crossing regions of scan lines and data lines and arranged in a repeating pattern, the first, second and third sub-pixels for emitting light of different colors;
    a scan driver for supplying scan signals to the scan lines;
    a data driver for supplying data signals to the data lines; and
    a data distributor between the data driver and the data lines for distributing the data signals from output lines of the data driver to the data lines,
    wherein ones of the first and second sub-pixels are alternately arranged in a first column, and ones of the third sub-pixels are arranged in a second column adjacent to the first column,
    wherein a first data line of the data lines connects the first sub-pixels in the first column to the data distributor, a second data line of the data lines connects the second sub-pixels in the first column to the data distributor, and a third data line of the data lines connects the third sub-pixels in the second column adjacent to the first sub-pixels in the first column and the third sub-pixels in the second column adjacent to the second sub-pixels in the first column to the data distributor, such that the data distributor is configured to distribute the data signals to the first data line and the third data line without distributing the data signals to the second data line in accordance with a first scan signal, and to distribute the data signals to the second data line and the third data line without distributing the data signals to the first data line in accordance with a second scan signal, and
    wherein the data distributor comprises:

a plurality of first transistors for connecting data lines connected to the third sub-pixels from among the data lines to corresponding ones of the output lines of the data driver when a first clock signal is supplied;

a plurality of second transistors for connecting data lines connected to the first and second sub-pixels in odd-numbered rows from among the data lines to the corresponding ones of the output lines of the data driver when a second clock signal is supplied; and a plurality of third transistors for connecting data lines connected to the first and second sub-pixels in even-numbered rows from among the data lines to the corresponding ones of the output lines of the data driver when a third clock signal is supplied, wherein the first, second and third clock signals do not overlap with one another, and wherein the scan signals are sequentially supplied to the scan lines, the first clock signal is supplied to the data distributor after each of the scan signals is supplied, and the second and third clock signals are alternately supplied to the data distributor after each of the scan signals is supplied.

2. The organic light emitting display device according to claim 1, further comprising a third column adjacent to the second column in which other ones of the first and second sub-pixels are alternately arranged, and a fourth column adjacent to the third column in which other ones of the third sub-pixels are arranged, wherein the first and second sub-pixels in the first and third columns are respectively arranged diagonally about the second column in a substantially checkerboard arrangement.

3. The organic light emitting display device according to claim 1, wherein a width of the third sub-pixels is narrower along a horizontal axis than a width of each of the first and second sub-pixels, and a number of the third sub-pixels is two times a number of each of the first and second sub-pixels.

4. The organic light emitting display device according to claim 1, wherein:

the repeating pattern is divided into sub-pixel groups each comprising two first sub-pixels, two second sub-pixels and four third sub-pixels, arranged in two adjacent rows and four adjacent columns; and each of the sub-pixel groups comprises:

one first sub-pixel and one second sub-pixel sequentially arranged in the first column;

two third sub-pixels arranged in the second column;

one second sub-pixel and one first sub-pixel sequentially arranged in a third column adjacent to the second column; and two third sub-pixels arranged in a fourth column adjacent to the third column.

5. The organic light emitting display device according to claim 4, wherein the repeating pattern is repeated at least once in a row direction and at least once in a column direction.

6. The organic light emitting display device according to claim 4, wherein the third sub-pixels have a width that is half of a width of each of the first and second sub-pixels along the horizontal axis.

7. The organic light emitting display device according to claim 1, wherein the first sub-pixels are red sub-pixels, the second sub-pixels are blue sub-pixels, and the third sub-pixel are green sub-pixels.

8. The organic light emitting display device according to claim 1, wherein the first and second clock signals are sequentially supplied during a period between when a scan signal of the scan signals is supplied to an (i−1)-th scan line of the scan lines ("i" is a natural number) and when a scan signal of the scan signals is supplied to an i-th scan line of the scan lines, and the first and third clock signals are sequentially supplied during a period between when the scan signal is supplied to the i-th scan line and when a scan signal of the scan signals is supplied to an (i+1)-th scan line of the scan lines.

9. The organic light emitting display device according to claim 1, wherein the data lines comprise a plurality of first data lines for respectively connecting the first sub-pixels in corresponding columns to the data distributor; a plurality of second data lines for respectively connecting the second sub-pixels in corresponding columns to the data distributor; and a plurality of third data lines for respectively connecting the third sub-pixels in corresponding columns to the data distributor.

10. The organic light emitting display device according to claim 9, wherein a number of the first data lines, a number of the second data lines, and a number of the third data lines are the same as one another.

11. The organic light emitting display device according to claim 1, wherein a number of the third sub-pixels corresponds to a resolution of the display region, and a number of the first sub-pixels and a number of the second sub-pixels corresponds to half of the resolution of the display region.

12. The organic light emitting display device according to claim 1, wherein the first column does not include third sub-pixels, and the second column does not include first or second sub-pixels.

* * * * *

UNITED STATES PATENT AND TRADEMARK OFFICE
CERTIFICATE OF CORRECTION

PATENT NO. : 8,581,812 B2  
APPLICATION NO. : 12/783481  
DATED : November 12, 2013  
INVENTOR(S) : Won-Kyu Kwak et al.

Page 1 of 1

It is certified that error appears in the above-identified patent and that said Letters Patent is hereby corrected as shown below:

In the Claims

Column 10, Claim 7, line 12    Delete "sub-pixel"  
                                             Insert -- sub-pixels --

Signed and Sealed this  
Second Day of June, 2015

Michelle K. Lee  
*Director of the United States Patent and Trademark Office*